United States Patent [19]

Haskell et al.

[11] Patent Number: 4,677,589
[45] Date of Patent: Jun. 30, 1987

[54] DYNAMIC RANDOM ACCESS MEMORY CELL HAVING A CHARGE AMPLIFIER

[75] Inventors: Jacob D. Haskell, Palo Alto; Craig S. Sander, Cupertino, both of Calif.

[73] Assignee: Advanced Micro Devices, Inc., Sunnyvale, Calif.

[21] Appl. No.: 759,532

[22] Filed: Jul. 26, 1985

[51] Int. Cl.$^4$ .............................................. G11C 11/24
[52] U.S. Cl. ..................................... 365/149; 365/177
[58] Field of Search ................. 365/149, 177, 174, 189

[56] References Cited

U.S. PATENT DOCUMENTS 3,745,539  7/1973  Davidson et al. .................... 365/177
4,168,536  9/1979  Joshi et al. ............................ 365/149

OTHER PUBLICATIONS

R. A. Carballo et al., "High Performance/Density Dynamic RAM Cell", IBM Technical Disclosure Bulletin, vol. 26, No. 7A, Dec. 1983, pp. 3227–3228.
Chung-Yu Wu, "A New Dynamic Random Access Memory Cell Using a Bipolar MOS Composite Structure", IEEE Transactions on Electron Devices, vol. ED-30, No. 8, Aug. 1983, pp. 886–894.

Primary Examiner—Joseph A. Popek
Attorney, Agent, or Firm—J. Vincent Tortolano; Patrick T. King

[57] ABSTRACT

An improved dynamic random access memory (DRAM) cell circuit (46) having a charge amplifier is presented. The improvement comprises a bipolar amplification means (64) for amplifying a charge as it is read out of the memory cell (46). According to one embodiment of the present invention, in addition to a standard charge storage capacitor (50) and MOS transistor (48), the memory cell (46) also includes a write control line (60) and a second MOS transistor (62) for writing a "1" bit of information into the memory cell (46). These improvements require little or no additional space when used in a DRAM circuit and allow a reduction in the required capacitor area.

6 Claims, 4 Drawing Figures

DYNAMIC RANDOM ACCESS MEMORY CELL HAVING A CHARGE AMPLIFIER

BACKGROUND OF THE INVENTION

1. FIELD OF THE INVENTION

The present invention relates generally to metal-oxide semiconductor (MOS) dynamic random access memory (DRAM) circuits fabricated in the form of semiconductor integrated circuit chips, and more particularly to an improved DRAM cell having a charge amplifier for amplifying the charge output from a storage device within the memory cell.

2. DESCRIPTION OF THE PRIOR ART

The rapid advancement of semiconductor manufacturing technology in recent years can be clearly seen in the evolution of metal oxide silicon (MOS) dynamic random access memories (DRAMs) during this period. Early 1-kilobit (1024 bits) DRAMs using three or four transistors per memory cell were followed by 4-kilobit DRAMs employing the now widely utilized one-transistor-one-capacitor cell design.

Further improvements in bit density were achieved by enhanced processing techniques. Techniques such as the use of double level polysilicon conductors led to the production of the 16 kilobit DRAM.

Further recent advances in semiconductor manufacturing have allowed capacitative memory circuits to evolve from the 16 kilobit DRAM to commercially available semiconductor integrated circuit chips capable of storing 65,536 bits (64 kilobits). Quite recently, moreover, a few manufacturers have introduced a 256K (262,144 bits) memory unit on one chip, and the future prospect believed possible is the 1,000,000-bit chip.

Notwithstanding these recent advances in semiconductor memory technology, the desire to incorporate more and more functional circuitry on each individual chip, together with the commercial realities of yield, cost, and the like, have caused the semiconductor area available for circuitry to become extremely valuable. Concomitant with advances in memory cell fabrication is the development of improved techniques of packing more and more circuitry on smaller and smaller areas of silicon. Thus, when limits in fabrication techniques are encountered, industry focus turns to more efficient circuit design to reduce the component count and, in turn, to reduce the chip area upon which the circuit is formed.

One problem associated with high density DRAM circuits is the decrease in the signal strength produced by an individual memory cell which results when capacitor area is decreased as a means of shrinking cell size. As the cell signal is decreased, the sensitivity of the sense amplifier used to sense that signal during a read operation must be increased. The degree to which the sensitivity of a sense amplifier can be increased, however, is limited by the sense amplifier's susceptibility to faulty operation caused by electrical noise or alpha particle incursion.

One technique which can be used to compensate for a decreased cell signal is to amplify the cell output before it is received on the bit line to the sense amplifier. One such circuit is described in U.S. Pat. No. 4,168,536 and shown in FIG. 1. A memory cell circuit 10 utilizes a MOS transistor 12 to amplify a voltage developed across a resistor 14 when a "0" bit of information stored on a storage capacitor 16 is to be read. The disadvantage of this design is the added space required for the addition of the transistor 12 and the resistor 14. The reduction in capacitor size and chip area for the cell obtained by employing signal amplification is negated by the extra space required for the additional components.

Another attempt to scale down memory cell size includes the substitution of a bipolar transistor for the traditional storage capacitor. See, e.g., Chung-Yu Wu, "A New Dynamic Random Access Memory Cell Using a Bipolar MOS Composite Structure," *IEEE Transactions on Electron Devices,* Vol. ED-30, No. 8, August 1983, pp. 886–894. This composite structure, shown in FIG. 2 and described in more detail below, results, however, in a decrease in cell signal size.

SUMMARY OF THE INVENTION

It is an object, therefore, of the present invention to provide an improved metal-oxide-semiconductor dynamic random access memory cell having a small area and a larger than normal cell signal.

It is a further object of the present invention to provide a high density memory array having cells which produce amplified signals while occupying very small areas.

It is yet another object of the present invention to provide an improved memory cell having two active devices including a bipolar amplification means for amplifying the cell's output signal.

Accordingly, the present invention is directed to an improved memory cell for a dynamic random access memory (DRAM) circuit having a bipolar amplification means for amplifying the charge output from a charge storage capacitor within the memory cell. The DRAM circuit includes, in addition to the charge storage capacitor, first and second reference potential terminals, a word line, a bit line and an MOS transistor. A first terminal of the storage capacitor is coupled to the first reference potential terminal and a second terminal of the charge storage capacitor is coupled to a first terminal of the MOS transistor. In accordance with a first embodiment of the present invention, the bipolar amplification means has a first terminal coupled to a second terminal of the MOS transistor, a second terminal coupled to the second reference potential terminal, and a third terminal coupled to the bit line of the DRAM circuit.

In accordance with a second embodiment of the present invention, an improved memory cell for a DRAM circuit is provided having a write control means, and a bipolar amplification means. The write control means includes a write control terminal and an MOS switching means. A first terminal of the MOS switching means is coupled to a first reference potential terminal of the DRAM circuit. The MOS switching means also has a second terminal coupled both to a capacitor of the DRAM circuit and to the write control means, and a third terminal coupled to the capacitor and to a first MOS transistor of the DRAM circuit. The bipolar amplification means is coupled to the first MOS transistor, and to a second reference potential terminal and also to a bit line of the DRAM circuit.

An advantage of the present invention is that the increased signal obtainable from the memory cell allows the cell to be scaled down to a much greater degree than is possible with traditional DRAM cell designs.

Another advantage of the present invention is that the increased signal obtainable from the memory cell allows sense amplifier circuitry to be designed for a relatively large voltage swing, thereby alleviating potential problems of faulty operation of the sense amplifier due to noise within the memory circuit.

The foregoing and other objects, features and advantages of the invention will be apparent from the following specification, claims and the attached drawings.

DETAILED DESCRIPTION OF THE SPECIFIC EMBODIMENTS

Reference is now made in detail to the specific embodiments of the present invention, which illustrate the best mode presently contemplated by the inventors for practicing the invention, the specific embodiments of which are set forth in the accompanying drawings.

Figure 1:
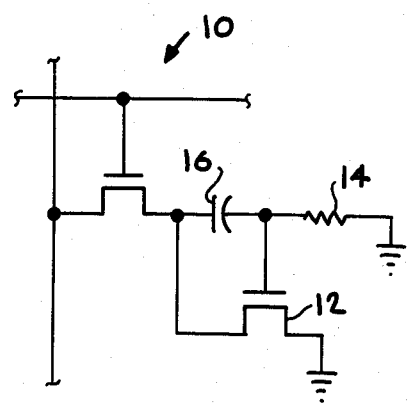
FIG. 1 is a schematic diagram of a prior art memory cell circuit utilizing a MOS transistor and a resistor for cell signal amplification.
Figure 2:
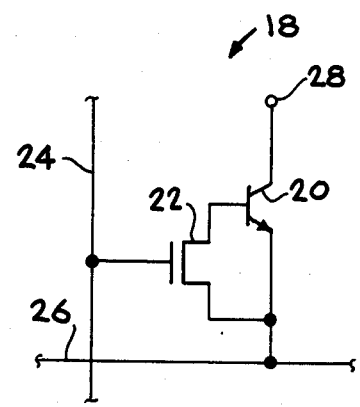
FIG. 2 is a schematic diagram of a prior art memory cell circuit which incorporates an n-p-n bipolar junction transistor with an n-channel MOSFET in a composite structure.

Referring now to the drawings, in FIG. 2 a schematic diagram is shown of a prior art memory cell circuit 18 which incorporates an n-p-n bipolar junction transistor 20 with an n-channel MOS field effect transistor (FET) 22 in a composite structure. A gate electrode of the MOSFET 22 is coupled to a word line 24. One source/drain terminal of the MOSFET 22 is coupled to the base of the bipolar transistor 20. The other source/drain terminal of the MOSFET 22 is coupled to the emitter terminal of the bipolar transistor 20, which emitter terminal is coupled to a bit line 26. The collector terminal of the bipolar transistor 20 is coupled to a reference voltage terminal 28.

The MOSFET 22 serves as a transfer gate to charge and discharge the storage capacitor of the memory cell circuit 18, similar to the transistor in a standard one transistor-one capacitor dynamic memory cell. However, the storage capacitor of the memory cell circuit 18 is the base collector p-n junction capacitor instead of the MOS capacitor of the typical memory cell. Thus, unlike the present invention, the bipolar transistor 20 is not utilized to amplify a signal from the memory cell but is utilized rather as the storage capacitor of the memory cell.

The basic advantage claimed for the composite structure memory cell 18 is that it can be scaled down more easily than the traditional one transistor-one capacitor memory cell. Although an extra contact is needed for the bipolar transistor, the area of this contact plus other spacings is expected to be smaller than that of the storage capacitor in a conventional memory cell. Note, however, that the authors of the above-referenced article indicate that the p-n junction capacitance per unit area is *lower* than the MOS capacitance per unit area, although other adjustments in cell layout are said to be possible in order to obtain a larger signal size. See Wu, above, p. 889.

Figure 3:
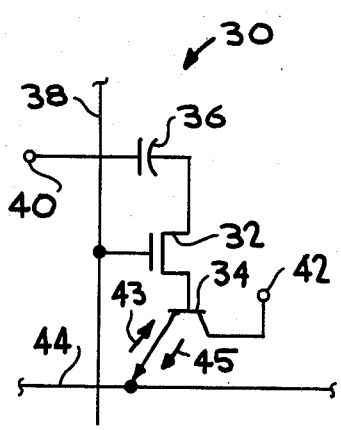
FIG. 3 is a schematic diagram of a first embodiment of the memory cell of the present invention.

Referring now to FIG. 3, a schematic diagram is shown of a specific embodiment of a memory cell circuit 30 of the present invention. The memory cell circuit 30 includes an MOS transistor 32, a bipolar amplification means 34, a charge storage capacitor 36, a word line 38, first and second reference potential terminals 40,42 and a bit line 44. In this particular embodiment of the present invention, the MOS transistor 32 is a p-channel device and the bipolar amplification means 34 is an n-p-n bipolar transistor.

A first terminal of the storage capacitor 36 is coupled to the first reference potential terminal 40 and a second terminal of the charge storage capacitor 36 is coupled to a first terminal of the MOS transistor 32.

A second terminal of the MOS transistor 32 is coupled to a base terminal of the bipolar amplification means 34, and the gate terminal of the MOS transistor 32 is coupled to the word line 38. A collector terminal of the bipolar amplification means 34 is coupled to the second reference potential terminal 42. An emitter terminal of the bipolar amplification means is coupled to the bit line 44.

It will be noted that according to this first embodiment of the present invention, the memory cell circuit 30 includes a bipolar amplification means, in addition to the MOS transistor and storage capacitor of a typical DRAM cell. However, the memory cell 30 is no larger than the standard one-capacitor, one-transistor cell, because the inclusion of the additional bipolar amplification means 34 is accomplished by the formation of an emitter region under and in contact with the bit line 44, such that no increase in lateral die space is required.

In operation, the first reference potential terminal 40 may be fixed at any potential between and including the high and low potentials used in the circuit, and the second reference potential 42 is taken to a high level potential. To write a "0" or a "1" bit of information into the memory cell 30, the bit line 44 is taken to a low level or a high level potential ("LOW" or "HIGH") depending upon the information to be written, and the word line 38 is taken LOW, turning on the MOS transistor 32. The potential on the bit line is transferred through the base-emitter junction of the bipolar amplification means 34, as shown by arrows 43 or 45, and via the conducting MOS transistor 32 to the storage capacitor 36. The word line is then taken HIGH turning off the MOS transistor 32 such that the potential transferred from the bit line 44 is retained as a charge by the storage capacitor 36.

In order to read information stored in the memory cell 30, the word line is taken LOW, turning on the MOS transistor 32. The charge stored on the storage capacitor 32 flows via the MOS transistor 32 into the base of the bipolar amplification means 34. The charge is amplified by the beta of the bipolar amplification means 34 and is dumped onto the bit line 44 through the emitter terminal of the bipolar amplification means 34, as shown by arrow 45.

It will be observed that according to the specific embodiment of the present invention described above, during the write operation of a "1" (HIGH level) it is necessary to reverse bias the bipolar amplification means 34 with a bit line potential sufficient to exceed the base-emitter breakdown voltage of the bipolar amplification means 34. This can be accomplished by utilizing proper doping levels during fabrication of the bipolar amplification means 34. However, operating the bipolar amplification means 34 in a manner in which its breakdown voltage is frequently exceeded may cause it to wear out more rapidly than if operated only in a forward biased mode. The resulting leakage problems due to wear are preferably to be avoided, if possible.

Figure 4:
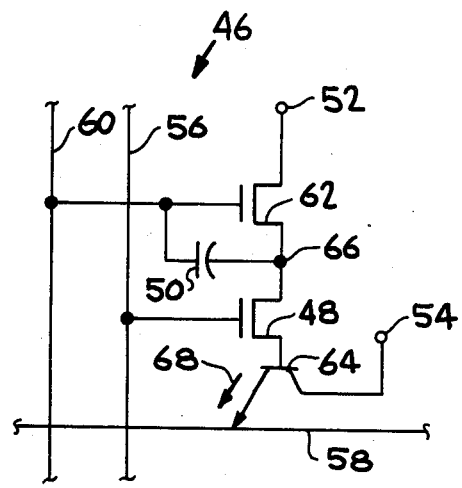
FIG. 4 is a schematic diagram of a second embodiment of the memory cell of the present invention.

Accordingly, referring now to FIG. 4, a schematic diagram is shown of a second embodiment of a memory cell circuit 46 of the present invention. The memory cell circuit 46 includes a first MOS transistor 48, a charge storage capacitor 50, first and second reference potential terminals 52,54, a word line 56 and a bit line 58. Memory cell circuit 46 further includes a write control line 60, a second MOS transistor 62 and a bipolar amplification means 64. In the second specific embodiment of the present invention, the first and second MOS transistors 48 and 62 are both p-channel devices each having first and second terminals and a gate terminal, and the bipolar amplification means 64 comprises an n-p-n bipolar transistor having base, emitter and collector terminals. The gate terminal of the second MOS transistor 62 is coupled to the write control line 60. The gate terminal of the first MOS transistor 48 is coupled to the word line 56.

A first terminal of the storage capacitor 50 is coupled to the gate terminal of the second MOS transistor 62. The second terminal of the storage capacitor 50 is coupled at a common node 66 between the first and second MOS transistors 48 and 62, to the second terminal of the second MOS transistor 62 and to the first terminal of the first MOS transistor 48.

The first terminal of the second MOS transistor 62 is coupled to the first reference potential terminal 52. The second terminal of the second MOS transistor 62 is coupled at the node 66 to the second terminal of the storage capacitor 50 and to the first terminal of the first MOS transistor 48.

The second terminal of the first MOS transistor 48 is coupled to a base terminal of the bipolar amplification means 64. A collector terminal of the bipolar amplification means 64 is coupled to the second reference potential terminal 54. An emitter terminal of the bipolar amplification means 64 is coupled to the bit line 58.

In operation, the first and second reference potential terminals 52 and 54, respectively, are set HIGH. To write a "1" bit of information into the memory cell 46, the write control line 60 is taken LOW, turning on the second MOS transistor 62, and the word line 56 is taken HIGH, turning off the first MOS transistor 48. This causes node 66 to go HIGH. The write control line 60 is then taken back HIGH, turning off the second MOS transistor 62, such that the potential representing a "1" bit of information is stored by capacitor 50.

In order to write a "0" bit of information into the memory cell 46, the write control line 60 is taken HIGH, the second MOS transistor 62 therefore being nonconductive, and the bit line 58 is taken LOW. The word line 56 is taken LOW, turning on the first MOS transistor 48. This causes the potential representing a "0" to be developed across the capacitor 50.

In order to read information stored in the memory cell 46, the operation is similar to that described above in connection with FIG. 3. The word line 56 is taken LOW, turning on the first MOS transistor 48. Any charge stored at the node 66 flows via the first MOS transistor 48 into the base terminal of the bipolar amplification means 64. The charge is amplified by the beta of the bipolar amplification means 64 and is dumped onto the bit line 58 through the emitter terminal of the bipolar amplification means 64, as shown by arrow 68.

Similar to the first embodiment, it will be noted that according to the second embodiment of the present invention, the memory cell circuit 46 includes an extra MOS transistor and a bipolar amplification means in addition to the MOS transistor and storage capacitor of a typical DRAM cell. However, as explained above, no more space is required to fabricate the memory cell 46 than is required to fabricate a standard one-capacitor, one-transistor cell.

The addition of the second MOS transistor 62 to the standard memory cell is likewise accomplished without a corresponding increase in die space. The second MOS transistor 62, in fact, exists as a parasitic device in the standard one transistor-one capacitor memory cell. This parasitic capacitor is kept from operating in a standard cell by holding the gate terminal of the parasitic capacitor at some fixed potential. In the preferred embodiment of the present invention, adjusting the doping levels of the second MOS transistor 62 during fabrication allows the second MOS transistor 62 to be turned on and off by switching the write control line 60 between LOW and HIGH potentials. Thus, by merely changing the electrical characteristics of the standard cell an additional MOS transistor is included.

The foregoing description of specific embodiments of the present invention have been presented for purposes of illustration and description. It is not intended to be exhaustive or to limit the invention to the precise form disclosed, and obviously many modifications and variations are possible in light of the above teaching. The embodiments were chosen and described in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto and their equivalents.

What is claimed is:

1. An improved memory cell for a dynamic random access memory (DRAM) circuit having first and second reference potential terminals, a word line, a bit line, a capacitor, a first MOS transistor having a first terminal coupled at a charge storage node to a first terminal of said capacitor, said first MOS transistor also having a gate terminal coupled to said word line, the improvement comprising:
 write control means, having:
  a write control line, and
  an MOS switching means having a first terminal coupled to said first reference potential terminal, a second terminal coupled to said write control line and further coupled to a second terminal of said capacitor, said MOS switching means also having a third terminal coupled at said charge storage node to said first terminal of said capacitor, and to said first terminal of said first MOS transistor; and
 a bipolar amplification means having a first terminal coupled to a second terminal of said first MOS transistor, a second terminal coupled to said second reference potential terminal and a third terminal coupled to said bit line, such that a charge amplified by said bipolar amplification means is received on said bit line.

2. A memory cell in accordance with claim 1, wherein said MOS switching means comprises a second MOS transistor.

3. A memory cell in accordance with claim 2, wherein said bipolar amplification means comprises a bipolar transistor, and said first, second and third terminals of the bipolar amplification means comprise, respectively, a base terminal, a collector terminal, and an emitter terminal of the bipolar transistor.

4. A memory cell in accordance with claim 3, wherein said first and second MOS transistors each comprises a p-channel MOS transistor and said bipolar transistor comprises an n-p-n bipolar transistor.

5. A memory cell in accordance with claim 3, wherein said first and second MOS transistors each comprises an n-channel MOS transistor and said bipolar transistor comprises a p-n-p bipolar transistor.

6. In a dynamic random access memory (DRAM) circuit, a memory cell comprising:
- a first MOS transistor having first and second source/drain terminals and a gate terminal, said first source/drain terminal being coupled to a first reference potential terminal of said DRAM circuit;
- a capacitor for storing a charge, said capacitor having a first terminal coupled to said gate terminal of said first MOS transistor, and a second terminal coupled to said second source/drain terminal of said MOS transistor;
- a write control line for writing a "1" bit of information into said memory cell, said write control line being coupled at a first common node to said first terminal of said capacitor and to said gate terminal of said first MOS transistor;
- a second MOS transistor having first and second source/drain terminals and a gate terminal, said first source/drain terminal of said second MOS transistor being coupled at a second common node to said second terminal of said capacitor and to said second source/drain terminal of said first MOS transistor, and said gate terminal of said second MOS transistor being coupled to a word line of said DRAM circuit; and
- a bipolar transistor having a base terminal coupled to said second source/drain terminal of said second MOS transistor, a collector terminal coupled to a second reference potential terminal of said DRAM circuit, and an emitter terminal coupled to a bit line of said DRAM circuit, such that said bipolar transistor operates to amplify a charge being read out of said memory cell onto said bit line.

* * * * *